(12) United States Patent
Adamian et al.

(10) Patent No.: US 6,757,625 B2
(45) Date of Patent: Jun. 29, 2004

(54) METHOD, APPARATUS, AND ARTICLE OF MANUFACTURE FOR PREDICTING ELECTRICAL BEHAVIOR OF A MULTIPORT DEVICE HAVING BALANCED DEVICE PORTS

(75) Inventors: Vahe' A. Adamian, Lexington, MA (US); J. Bradford Cole, Westford, MA (US)

(73) Assignee: Agilent Technologies, Inc., Palo Alto, CA (US)

( * ) Notice: Subject to any disclaimer, the term of this patent is extended or adjusted under 35 U.S.C. 154(b) by 105 days.

(21) Appl. No.: 10/127,744

(22) Filed: Apr. 22, 2002

(65) Prior Publication Data

US 2003/0200039 A1 Oct. 23, 2003

(51) Int. Cl.⁷ .......................... G01R 15/00; G06F 19/00
(52) U.S. Cl. ......................................................... 702/57
(58) Field of Search .......................... 702/65, 57, 117, 702/108; 324/638

(56) References Cited

U.S. PATENT DOCUMENTS

| | | | |
|---|---|---|---|
| 4,962,359 A | * 10/1990 | Dunsmore | 324/638 |
| 5,025,402 A | 6/1991 | Winkelstein | |
| 5,434,511 A | 7/1995 | Adamian et al. | |
| 5,548,221 A | 8/1996 | Adamian et al. | |
| 5,578,932 A | 11/1996 | Adamian | |
| 5,793,213 A | 8/1998 | Bockelman et al. | |
| 6,106,563 A | 8/2000 | Stengel et al. | |
| 6,292,070 B1 | * 9/2001 | Merrill | 333/26 |
| 6,347,382 B1 | * 2/2002 | Nakayama et al. | 714/37 |
| 6,483,415 B1 | * 11/2002 | Tang | 336/200 |
| 6,539,344 B1 | * 3/2003 | Stengel et al. | 703/2 |
| 2002/0003455 A1 | * 1/2002 | Vandersteen et al. | 333/117 |
| 2002/0053899 A1 | 5/2002 | Adamian et al. | |
| 2003/0001710 A1 | * 1/2003 | Tang et al. | 336/200 |
| 2003/0135344 A1 | * 7/2003 | Martens | 702/117 |
| 2003/0173975 A1 | 9/2003 | Adamian | |
| 2003/0173978 A1 | 9/2003 | Adamian et al. | |

OTHER PUBLICATIONS

Agilent, "De–embedding and Embedding S–Parameter Networks Using a Vector Network Analyzer", Mar. 22, 2001, cover page.

Bockelman and Eisenstadt, "Calibration and Verification of the Pure–Mode Vector Network Analyzer", IEEE Transactions of Microwave Theory and Techniques, vol. 46, No. 7, Jul. 1998 p. 1009.

Bockelman, Eisenstadt, and Stengel, "Accuracy Estimation of Mixed–Mode Scattering Parameter Measurements", IEEE Transactions on Microwave Theory and Techniques, vol. 47, No. 1, Jan. 1999. p. 102.

Bockelman and Eisenstadt, "Combined Differential and Common–Mode Scattering Parameters: Theory and Simulation", IEEE Transactions on Microwave Theory and Techniques, vol. 43, No. 7, Jul. 1995, p. 1530.

* cited by examiner

*Primary Examiner*—Michael Nghiem
*Assistant Examiner*—Demetrius Pretlow

(57) ABSTRACT

A method of predicting electrical behavior of a device comprises the steps of representing at least one balanced matching network having a balanced input port and a balanced output port and further representing a connection between the matching network an a balanced output port and a balanced input port of a device. A matching network S-parameter matrix is calculated and a device S-parameter matrix is obtained either through a measurement or from a model. A cascaded S-parameter matrix for the matching network in combination with the device is calculated, and from the resulting cascaded S-parameter matrix, a mixed-mode cascaded S-parameters may be extracted. The mixed-mode cascaded S-parameters assist a designer in predicting and analyzing the electrical behavior of the differential and single-ended ports as well as the electrical interaction therebetween.

35 Claims, 8 Drawing Sheets

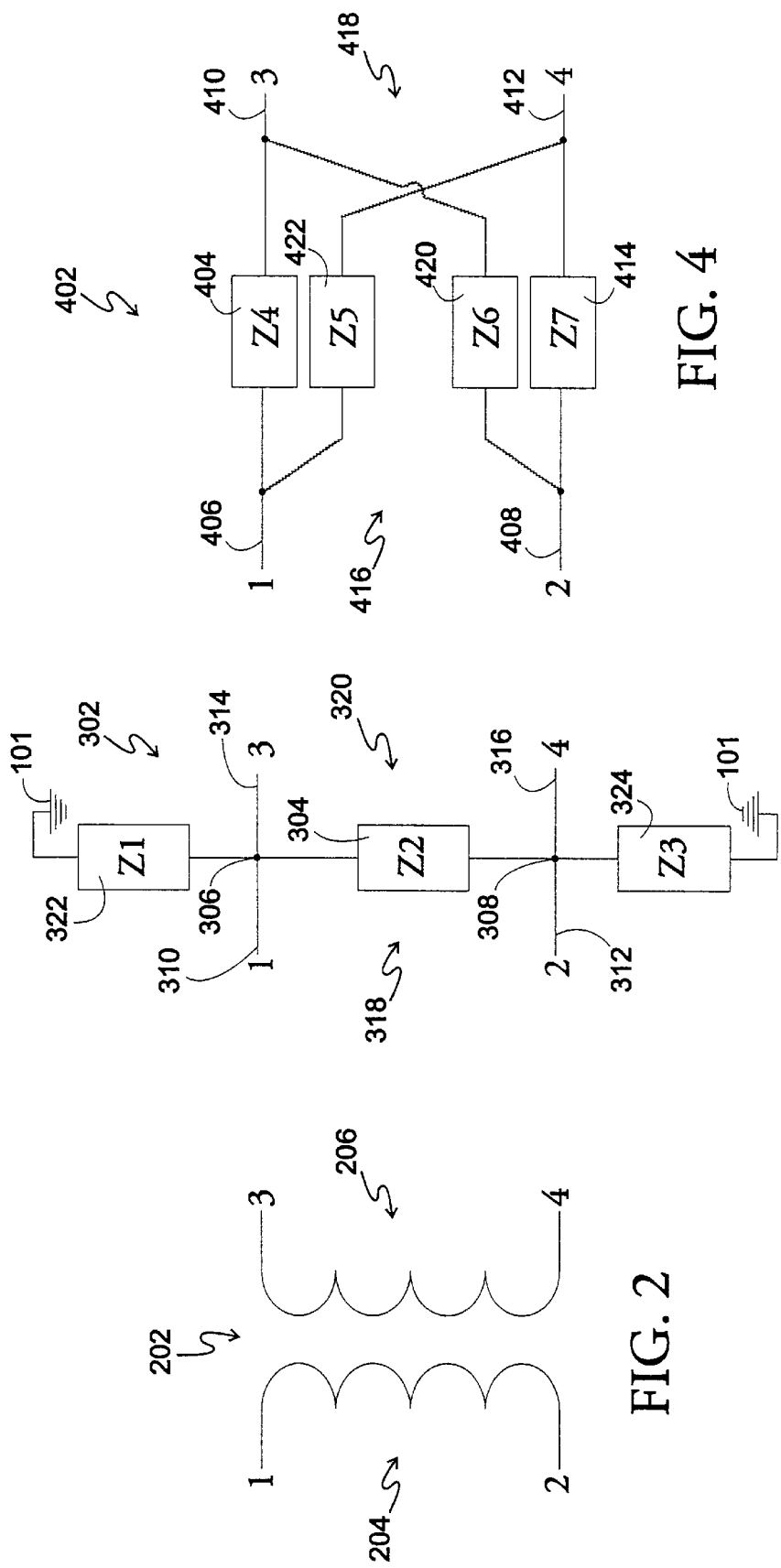

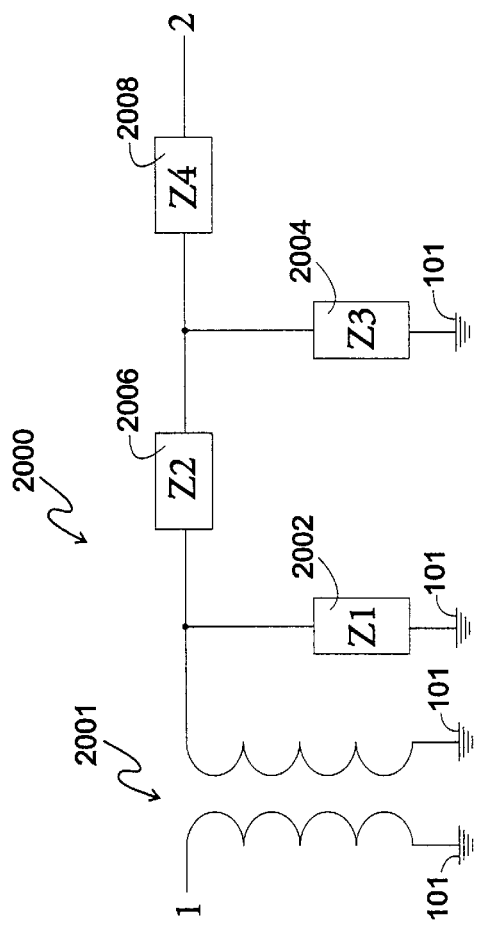
FIG. 20
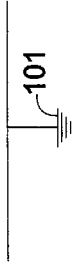
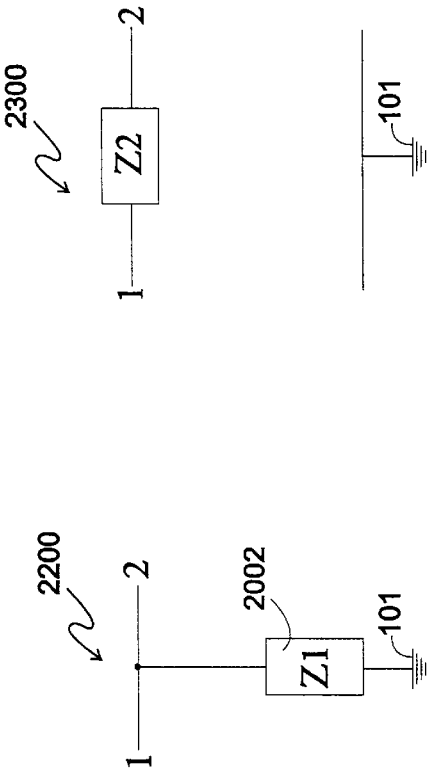
FIG. 22
FIG. 23
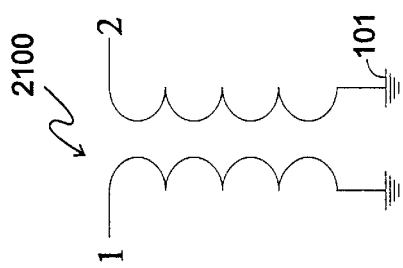
FIG. 21

METHOD, APPARATUS, AND ARTICLE OF MANUFACTURE FOR PREDICTING ELECTRICAL BEHAVIOR OF A MULTIPORT DEVICE HAVING BALANCED DEVICE PORTS

BACKGROUND

Data transfer rates for digital electronics are increasing in all areas of wire-less and wire-line communication. Accordingly, digital data streams for video, high-definition television (HDTV), graphics, serial interface and many other applications are requiring higher bandwidth. The increase in digital data transfer rates is due in part to the growing popularity of the Internet and requires high speed interconnects between chips, functional boards and systems. As one of ordinary skill in the art appreciates, the data is digital, but the transmission media that the digital data travels along is analog.

The increase in bandwidth serves to render the digital communication circuits more susceptible to noise sources. In order to achieve the higher data transmission rates, the electronic circuits must improve immunity to electromagnetic interference, be capable of suppression of even order harmonics, and have a higher tolerance to non-ideal grounds. Use of balanced transmission topologies helps to achieve the foregoing. Accordingly, balanced transmission topologies are becoming more prevalent than in the past. Those of skill in the art familiar with the term "balanced topology" understand it to mean that there are two appropriately coupled conductor lines delivering an electrical signal to a single balanced port of a device. Two terminals form a single balanced port of a device, where each terminal is connected to one of the coupled conductors. As used herein, the term "device" refers to any device or circuit that exhibits electrical behavior. An analysis of balanced devices may be achieved by transforming the standard S-parameters of the device into mixed-mode S-parameters. The mixed-mode S-parameters describe differential mode and common mode signals propagating in a balanced structure. The differential mode occurs when two coupled conductors are driven with equal magnitude and 180 degrees out of phase with respect to each other. The common mode occurs when two coupled conductors have equal magnitude and are in phase with respect to each other. An ideal signal in a balanced structure is pure differential mode. Differential mode is advantageous because a high-speed digital differential receiver can produce a larger voltage, relative to the single-ended case, and represents a digital "1" where the voltages on the coupled conductors represent the state "1" and have an opposite polarity. Similarly, the differential receiver produces a smaller voltage, relative to the single-ended case, and represents a digital "0" where the voltages on the coupled conductors represent state "0" and have an opposite polarity. The purpose of coupling the conductors of a balance topology is to force any common mode signal, such as noise generated in the return path of the ground plane, to appear equally and in-phase on both conductors, thereby canceling at the digital differential receiver.

As part of the toolkit used by digital designers of devices having single-ended topologies, test, measurement, and analysis methods have been developed to help designers predict electrical behavior of a device that is comprised of multiple interconnected devices and elements from a model. After preparing a device design, the designer is able to mathematically predict the electrical behavior of the newly designed device and compare it against desired performance specifications for the device. In some cases, the predicted electrical behavior does not meet the desired performance specifications and, therefore, does not address the needs to which a device is being designed. In such a case, an electronic designer chooses to not prototype the newly designed device and proceeds to re-design the device to achieve the desired predicted behavior. Obviating the prototyping step for an under-performing device prevents waste of effort and money and helps to improve time to market with a better-performing product.

Agilent Application note 1364-1 entitled "De-embedding and Embedding S-Parameter Networks Using a Vector Network Analyzer" (herein "De-embedding/Embedding Application Note"), teaches a method termed "de-embedding". The de-embedding method is used to determine the S-parameters of a device from a measurement of the device cascaded with two adapters, and a measurement of the two adapters themselves. The De-embedding/Embedding Application Note also teaches a method termed "embedding" for predicting electrical behavior of a modeled device. In the embedding process, a combination of device S-parameters and two adapter S-parameters helps to predict the behavior of the device in electrical combination with the adapters. The S-parameters used in the embedding process may be obtained from the de-embedding process or may be obtained through modeling a circuit and calculating the associated S-parameters. The use of the methods for embedding and de-embedding provide an important link between the computer aided design tools and the measurement tools in the electronic designers toolkit.

One limitation of the embedding method taught in the De-embedding/Embedding Application Note is the applications of the teachings are directed to single-ended devices. The prior art does not provide a method applicable to balanced devices, yet the use of balanced devices in the electronic design field is increasing. There is a need, therefore, for an embedding method applicable to balanced devices and circuits.

The use of devices and circuits having both balanced and single-ended device ports is also becoming more prevalent. Devices or circuits having both port styles are herein referred to as "mixed-port devices". It is to be understood that the term "devices" refers to both devices and circuits. In mixed-port devices, it is common that the single-ended device ports and balanced ports interface a single-ended topology with a balanced topology to integrate single-ended and balanced topologies together as a single working system. There is a need, therefore, for a method of predicting electrical behavior of both pure balanced as well as mixed-port devices.

In many balanced topologies, the user desires to predict the electrical behavior of a device when it is embedded in a matching network. Typically, a model or S-parameter measurement represents the matching network. A Vector Network Analyzer (VNA) measures the S-parameters of linear devices. Because most commercially available VNAs are calibrated to a 50-ohm standard, the measured S-parameters, $S_D$, are normalized to a 50-ohm characteristic impedance. The S-parameter matrix, $S_D$, therefore, is a function of the characteristic impedance. Some balanced devices such as balanced filters require normalization to a characteristic impedance other than the conventional 50-ohms for single-ended device ports and the conventional 100-ohms for balanced ports. Additionally, the device impedance normalization might be different from port to port. Many commercial Electronic Design Automation software packages are available to model single-ended matching networks represented by a model and permit the model to be normalized to a user-specified impedance. No such commercial software package exists for balanced and mixed-port topologies. There is a need, therefore, for a method of embedding pure differential and mixed-port devices that permits normalization to an arbitrary impedance value.

BRIEF DESCRIPTION OF THE DRAWINGS

FIG. 2 is a representation of a balanced impedance translation element.

FIG. 3 is a representation of a shunt network element.

FIG. 4 is a representation of a lattice network element.

FIG. 20 is a representation of an embodiment of a single-ended matching network according to the teachings of the present invention.

FIG. 21 is a representation of a single-ended impedance translation element.

FIG. 22 is a representation of a single-ended shunt network element.

FIG. 23 is a representation of a single-ended lattice network element that reduces down to a series impedance element.

DETAILED DESCRIPTION

Figure 1:
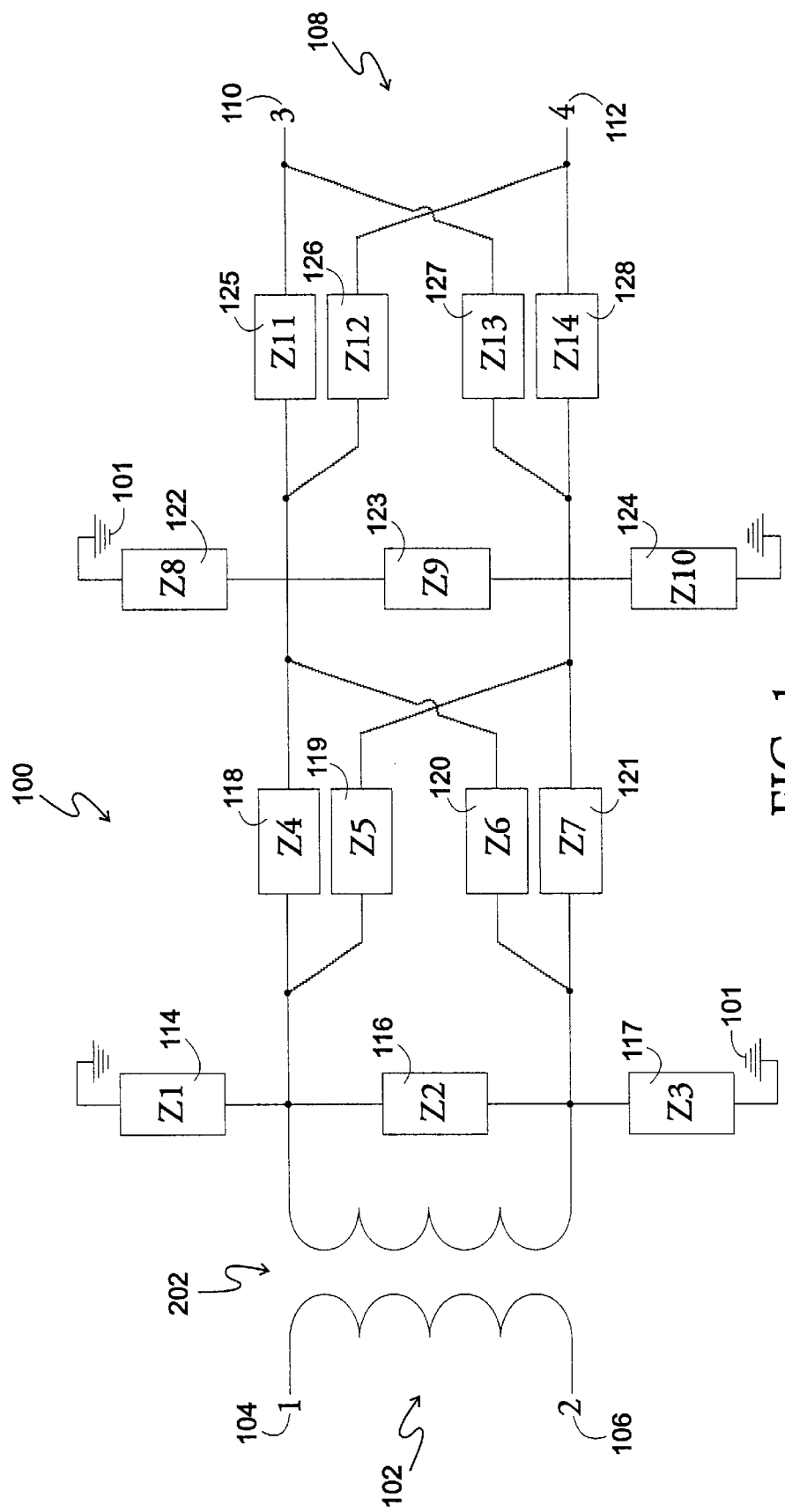
FIG. 1 is a representation of an embodiment of a balanced matching network according to the teachings of the present invention.

A matching circuit or network represents an electrical model that describes the impedance presented to a device. The teachings of the present invention permit specification of a particular matching circuit that is represented in combination with a device. With specific reference to FIG. 1 of the drawings, there is shown a matching network 100 having balanced input port 102, comprising first and second input terminals 104, 106 and balanced output port 108, comprising first and second output terminals 110, 112. The matching network 100 is an embodiment of a general circuit model to represent an impedance between the balanced input port 102 and the balanced output port 108. The embodiment of the matching network 100 shown in FIG. 1 comprises an electrical combination of three different sub-circuits. Each sub-circuit is represented with a respective single balanced input port and a single balanced output port.

Conventional VNAs measure parameters of a device in a fixed impedance environment. Typically, the fixed impedance environment is 50 ohms for all measured device ports and is referred to as the "reference characteristic impedance". It is desirable to permit selection of an arbitrary impedance for each port of a device being characterized. A first sub-circuit section is an impedance translation element 202 and is shown in FIG. 2 of the drawings. The impedance translation element 202 is an idealized model of a balanced 2-port circuit element that converts an impedance at a balanced impedance translation input port 204 to a different impedance at a balanced impedance translation output port 206.

A second sub-circuit section is a general balanced 2-port shunt network 302 as shown in FIG. 3. The shunt network 302 comprises a parallel impedance element 304 disposed between first and second shunt nodes 306, 308. The first shunt node 306 is common to first input terminal 310 and first output terminal 314. The second shunt node 308 is common to second input terminal 312 and second output terminal 316. First and second input terminals 310, 312 comprise first balanced input port 318 for the shunt network 302. First and second output terminals 314, 316 comprise second balanced output port 320 for the shunt network 302. The general shunt network 320 also comprises first shunt element 322 electrically disposed between the first shunt node 306 and common potential 101 and second shunt element 324 electrically disposed between second shunt node 308 and common potential 101. As one of ordinary skill in the art will appreciate, when using such a model, any one of the impedance elements may be generalized as either a short or an open circuit.

A third sub-circuit section is a general balanced 2-port lattice network 402 as shown in FIG. 4 of the drawings. The lattice network 402 comprises a first series impedance element 404 between first and third lattice network nodes 406, 410. The lattice network 402 also comprises a second series impedance element 414 between second and fourth lattice network nodes 408, 412. The first and second lattice network nodes 406, 408 comprise a balanced input port 416 of the lattice network 402. The third and fourth lattice network nodes 410, 412 comprise a balanced output port 418 of the lattice network 402. The general lattice network 402 further comprises first and second cross impedance elements 420, 422. The first cross impedance element 422 is electrically disposed between first and fourth lattice network nodes 406, 412. The second cross impedance element 420 is electrically disposed between second and third lattice network nodes 408, 410. As one of ordinary skill in the art will appreciate, when using such a model, any one of the impedance elements may be generalized as either a short or an open circuit.

The matching network embodiment shown in FIG. 1 comprises one impedance translation element 202 and two circuits comprising the combination of one shunt network 302 and one lattice network 402. FIG. 1 represents one embodiment of a general circuit to represent an impedance between the balanced input port 102 and the balanced output port 108. A more complex matching circuit may be represented as a combination circuit including as many additional shunt and lattice networks as necessary.

Figure 5:
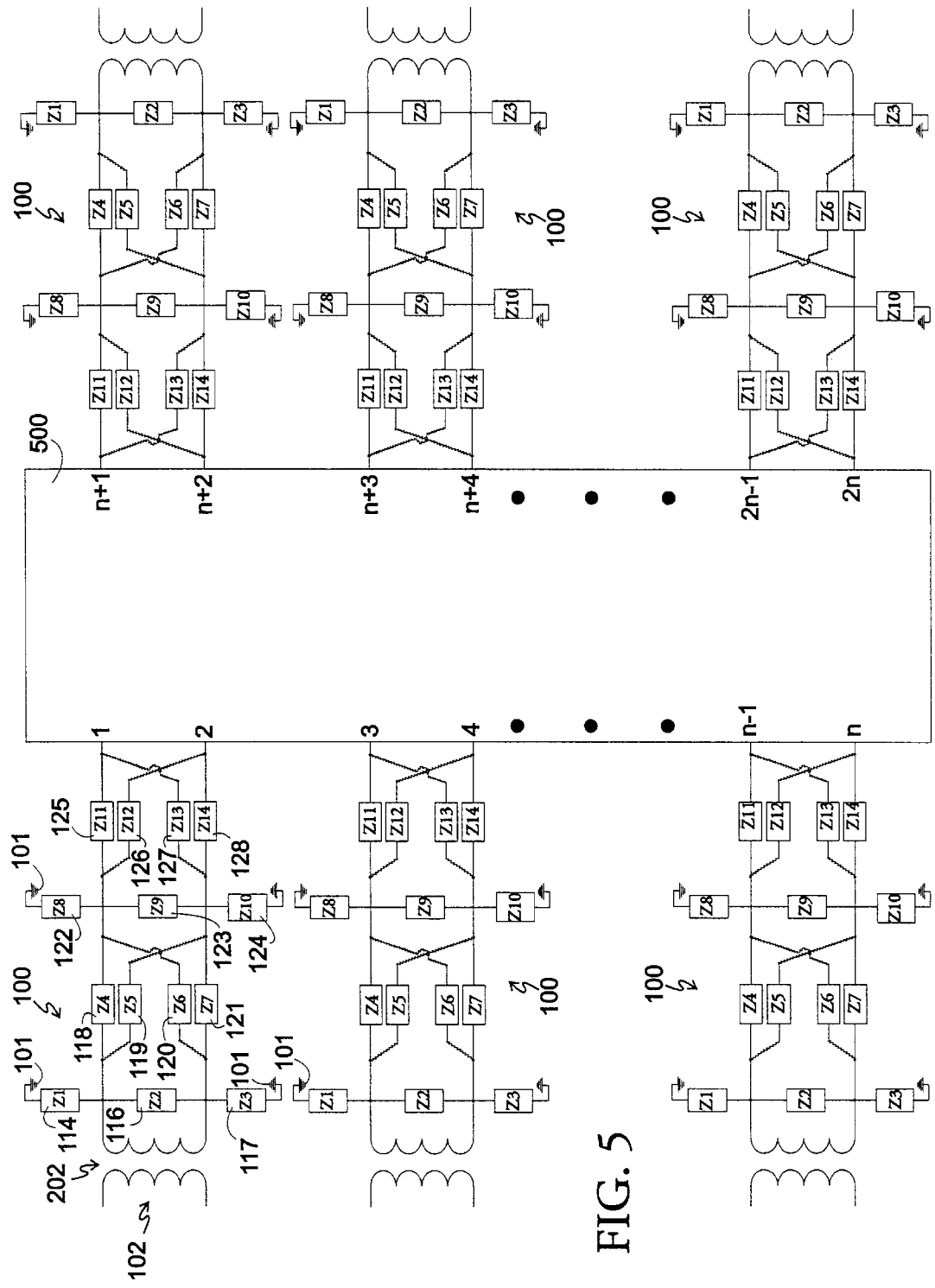
FIG. 5 is a representation of a balanced device having 2n balanced device ports, the device embedded in a plurality of balanced matching networks.
Figure 6:
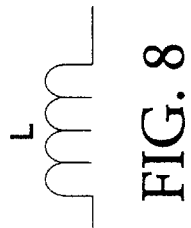
FIGS. 6–18 are examples of circuit elements that may be used together with the matching network of FIG. 1.
Figure 7:
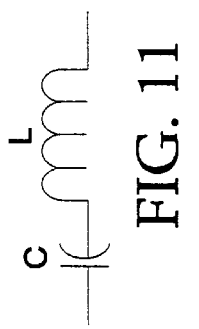
Figure 8:
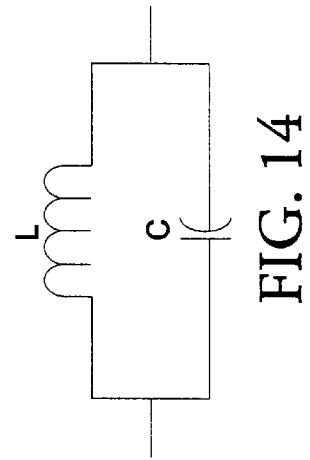
Figure 9:
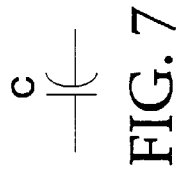
Figure 10:
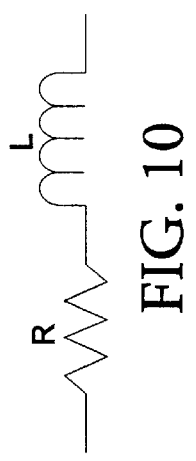
Figure 11:
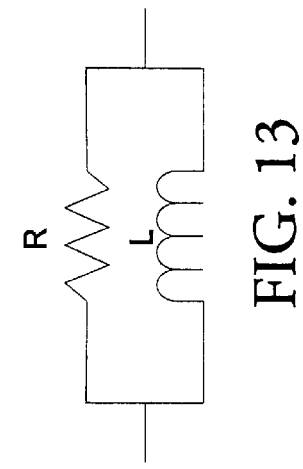
Figure 12:
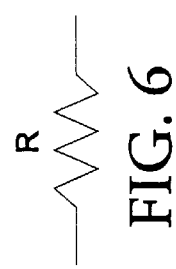
Figure 13:
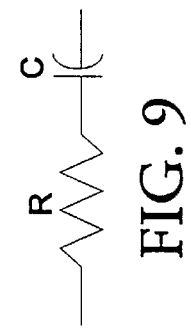
Figure 14:
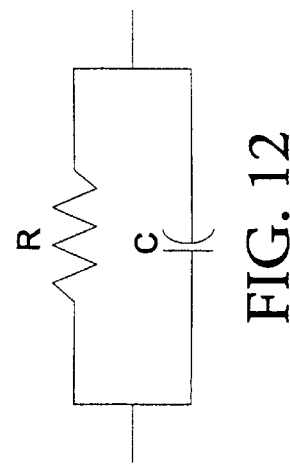

With specific reference to FIG. 5 of the drawings, there is shown a multi-port device 500 having a balanced topology. The device 500 is embedded within a plurality of balanced matching networks similar in structure to the balanced matching network 100 illustrated in FIG. 1 of the drawings. The teachings of the present invention together with the benefit of the disclosure of U.S. patent application Ser. No. 10/098,040 entitled "Method, Apparatus, and Article of Manufacture for Characterizing a Device and Predicting Electrical Behavior of the Device in a Circuit filed Mar. 14, 2002, (herein "the Embedding/De-embedding patent application") permit prediction of the S-parameters of the multi-port device 500 embedded within a plurality of the balanced matching networks 100. The Embedding/De-embedding patent application, the teachings of which are hereby incorporated by reference, teaches a method for predicting the behavior of any N-port device in electrical context with a 2N-port adapter to which it is connected. The teachings show how the electrical behavior of a cascaded combination of two devices or circuits may be predicted when the scattering parameters ("S-parameters") of both the device and the adapter(s) to which it is connected are known. The result is a cascaded S-parameter matrix, $S_C$.

To use the teachings of the Embedding/De-embedding patent application, the S-parameters of each one of the matching balanced networks, represented as $S_M$, are obtained. With specific reference to FIG. 3 of the drawings, Z1 represents the complex impedance of the first shunt element 322, Z2 represents the complex impedance of the parallel element 304, and Z3 represents the complex impedance element of the second shunt element 324. Accordingly, the open-circuit impedance matrix, Z, of the shunt network 302 is:

$$Z = \begin{bmatrix} \frac{Z1(Z2+Z3)}{Z1+Z2+Z3} & \frac{Z1Z2}{Z1+Z2+Z3} & \frac{Z1(Z2+Z3)}{Z1+Z2+Z3} & \frac{Z1Z2}{Z1+Z2+Z3} \\ \frac{Z1Z3}{Z1+Z2+Z3} & \frac{(Z1+Z2)Z3}{Z1+Z2+Z3} & \frac{Z1Z3}{Z1+Z2+Z3} & \frac{(Z1+Z2)Z3}{Z1+Z2+Z3} \\ \frac{Z1(Z2+Z3)}{Z1+Z2+Z3} & \frac{Z1Z3}{Z1+Z2+Z3} & \frac{Z1(Z2+Z3)}{Z1+Z2+Z3} & \frac{Z1Z3}{Z1+Z2+Z3} \\ \frac{Z1Z3}{Z1+Z2+Z3} & \frac{(Z1+Z2)Z3}{Z1+Z2+Z3} & \frac{Z1Z3}{Z1+Z2+Z3} & \frac{(Z1+Z2)Z3}{Z1+Z2+Z3} \end{bmatrix} \quad (1)$$

With specific reference to FIG. 4 of the drawings, Z4 and Z7 represent the complex impedance of the first and second series impedance element 404 and 414, respectively. Z5 and Z6 represent the complex impedance of the first and second cross impedance elements 422 and 420, respectively. Accordingly, the short-circuit admittance matrix, Y, of the lattice network 402 is:

$$Y = \begin{bmatrix} \frac{1}{Z4}+\frac{1}{Z5} & 0 & -\frac{1}{Z4} & -\frac{1}{Z5} \\ 0 & \frac{1}{Z6}+\frac{1}{Z7} & -\frac{1}{Z6} & -\frac{1}{Z7} \\ -\frac{1}{Z4} & -\frac{1}{Z6} & \frac{1}{Z4}+\frac{1}{Z6} & 0 \\ -\frac{1}{Z5} & -\frac{1}{Z7} & 0 & \frac{1}{Z5}+\frac{1}{Z7} \end{bmatrix} \quad (2)$$

Figure 15:
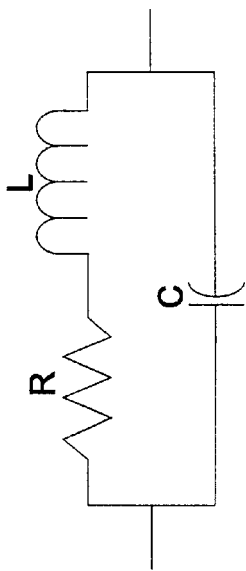
Figure 16:
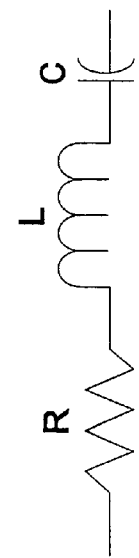
Figure 17:
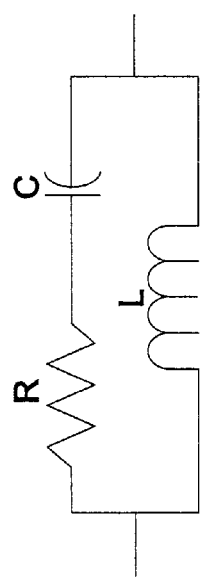
Figure 18:
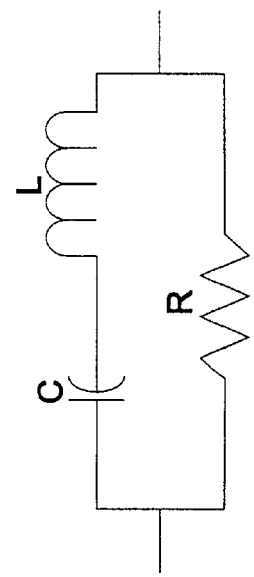

Each shunt, series and cross impedance element of the matching network illustrated in FIG. 1 of the drawings can be any one in a number of circuits. As an example and for illustrative purposes only, some of the more common circuit topologies are shown FIGS. 6 through 14 of the drawings. A designer of balanced topologies chooses to represent each one of the impedance elements 114 through 128 in a model of the matching network 100. Each one of the circuits shown in FIGS. 6 through 14 may be represented in terms of their complex impedances. Accordingly, each one of the impedance elements 114 through 128 that is a constituent part of the matching network 100 may be represented mathematically in terms of a real and imaginary impedance component. The real and imaginary parts of each complex impedance shown in FIGS. 6 through 14 are described by Equations 3 through 11, respectively.

$$Re(Z) = R, \; Im(Z) = 0 \quad (3)$$

$$Re(Z) = 0, \; Im(Z) = \frac{-1}{wC} \quad (4)$$

$$Re(Z) = 0, \; Im(Z) = wL \quad (5)$$

$$Re(Z) = R, \; Im(Z) = \frac{-1}{wC} \quad (6)$$

$$Re(Z) = R, \; Im(Z) = wL \quad (7)$$

$$Re(Z) = 0, \; Im(Z) = wL - \frac{1}{wC} \quad (8)$$

$$Re(Z) = \frac{R}{1+R^2w^2C}, \; Im(Z) = -\frac{R^2wC}{1+R^2w^2C} \quad (9)$$

$$Re(Z) = \frac{Rw^2L^2}{R^2+w^2L^2}, \; Im(Z) = \frac{R^2wL}{R^2+w^2L^2} \quad (10)$$

$$Re(Z) = 0, \; Im(Z) = \frac{wL}{1-w^2LC} \quad (11)$$

where, R represents resistance in ohms, L represents inductance in henries, C represents capacitance in farads and w=2πf, where π is a constant and f represents frequency of operation in Hertz. More complex impedance elements may be constructed from series or parallel interconnections of the common topologies given by FIGS. 6 through 14. As an example, FIG. 15 is constructed from a parallel combination of the circuits shown in FIGS. 8 and 9 of the drawings. FIG. 16 is constructed from a parallel combination of FIGS. 7 and 10. FIG. 17 is constructed from a parallel combination of FIGS. 6 and 11. FIG. 18 is constructed from a series combination of FIGS. 6, 7, and 8. The complex impedance characteristics of all of the circuits represented in FIGS. 6 through 18 may be stored in a software library. When a circuit designer is establishing the appropriate matching network 100, specific circuit topologies may be accessed from the library and inserted to the general model for the matching network using a conventional "click and drop" method. When all of the constituent impedances are selected for the matching network, the corresponding overall impedance may be calculated.

For each circuit having a complex impedance component, if the Q-factor and frequency of the inductive or capacitive reactance are specified, then the equivalent resistance can be calculated and substituted into the impedance element. The equivalent series resistance $R_{QL}$ of an inductor is given by:

$$R_{QL} = \frac{wL}{Q} \quad (12)$$

The equivalent series resistance $R_{QC}$ of a capacitor is given by:

$$R_{QC} = \frac{1}{wQC} \quad (13)$$

The equivalent parallel resistance $R_{QC}$ of a capacitor is given by:

$$R_{QC} = \frac{Q}{wC} \quad (14)$$

With specific reference to FIG. 1 of the drawings, all impedance elements 114 through 128 are normalized to the designated reference characteristic impedance, $Z_{ref}$, before calculating the open-circuit impedance, Z, and short-circuit admittance, Y, matrices. Typically, the reference characteristic impedance is designated as 50 ohms. The S-parameter matrix, S, in terms of the open-circuit impedance and short circuit admittance matrices is given by:

$$S=(Z+I)^{-1}(Z+J) \quad (15)$$

or $$S=(I+Y)^{-1}(I-Y) \quad (16)$$

where, I is a 4 by 4 identity matrix defined by:

$$I = \begin{bmatrix} 1 & 0 & 0 & 0 \\ 0 & 1 & 0 & 0 \\ 0 & 0 & 1 & 0 \\ 0 & 0 & 0 & 1 \end{bmatrix} \quad (17)$$

The S-parameters of each sub-circuit section that comprises the matching network 100 may be calculated from Equations (15) and (16). Using equations (1) or (2), it is possible to solve for the overall impedance matrix of each constituent circuit. Using the resulting impedance matrix in equations (15) or (16), it is possible to solve for the corresponding S-parameter matrix of the constituent circuit. Using the teachings of the Embedding/De-embedding patent application, it is possible to combine two S-parameter matrices to arrive at the S-parameter matrix for the electrical combination of two devices. This procedure is repeated for all sub-circuits sections until a single overall S-parameter matrix of the matching network 100, $S_M$, is determined. The resulting S-parameter matrix for the matching network 100, $S_M$, is normalized to the same reference characteristic impedance as the impedance or admittance matrices.

With specific reference to FIG. 5 of the drawings, there is shown the multi-port balanced device 500 embedded among a plurality of the balanced matching networks 100. Each balanced matching network 100 may be a different impedance network through selection of different constituent circuits for the impedance elements 114 through 128. Each of the matching networks 100 in which the balanced device 500 is embedded, will have a distinct matching network S-parameter matrix, $S_M$. The teachings of U.S. patent application Ser. No. 09/954,962 entitled "Method and Apparatus For Linear Characterization of Multi-terminal Single-ended or Balanced Devices" Filed Sep. 18, 2001 which claims priority from U.S. Provisional Application Ser. No. 60/233,596 (herein "the '596 Provisional Application") is incorporated by reference herein and discloses a method for extracting multi-port mixed-mode S-parameters. The method includes a transformation of a multi-port standard device S-parameter matrix, designated as $S_D$, into a linear balanced parameter, known as mixed-mode S-parameters, designated by the matrix $S_{Dmm}$. The mixed-mode S-parameters, $S_{Dmm}$, provide terms that define the interaction between balanced and single-ended ports of the device. The '596 Provisional Application describes a general unifying solution to extract the single-ended and balanced parameters of any multi-port pure balanced topology or any multi-port mixed-port topology. The method disclosed in the '596 Provisional Application is able to predict any coupling between the balanced and single-ended ports of the multi-port device including pure differential, pure common-mode, and pure single-ended electrical behavior as well as the interaction between the differential and common-mode behavior, differential and single-ended behavior, and single-ended and common-mode electrical behavior. Using the teachings of the Embedding/De-embedding patent application, if the S-parameters of the balanced device 500, $S_D$, are known, it is possible to determine the S-parameters of the cascaded combination of the multi-port balanced device 500 and the plurality of balanced matching networks 100. The resulting S-parameter matrix designation of the cascaded combination is $S_C$. After determining the S-parameters of the cascaded combination of the multi-port balanced device 500 and the plurality of matching networks 100, the resulting S-parameters, $S_C$, may be used with the benefit of the teachings of the '596 Provisional Application to extract the mixed-mode S-parameters of the cascaded combination, $S_{Dmm}$. The mixed-mode S-parameters provide information to help predict and analyze the differential, common mode, single ended, and mixed-mode behavior of the cascaded combination. Accordingly, it is possible to extract the mixed-mode S-parameter matrix of the electrical combination of the balanced device embedded in a plurality of the balanced networks 100 from the linear S-parameters of the device and an impedance model of the balanced matching networks 100.

Figure 19:
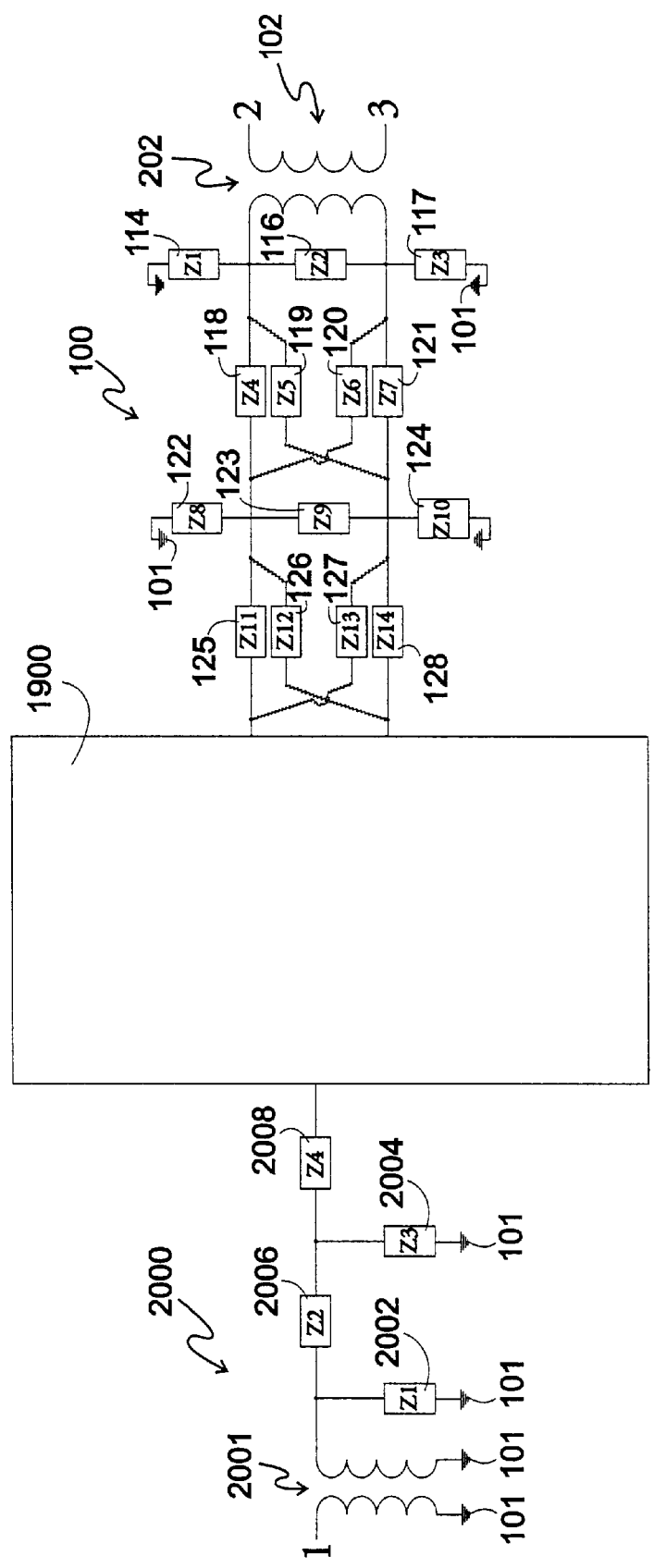
FIG. 19 illustrates a model of a device having one single-ended device port and one balanced device port in combination with one single-ended matching network and one balanced matching network, respectively.

There is also a need to predict the electrical behavior of a mixed-port device, i.e. a device having both single-ended and balanced ports. This scenario is an extension of the general solution presented herein. With specific reference to FIG. 19 of the drawings, there is shown a mixed-port device 1900. As illustrated, the mixed-port device 1900 is one that has both single-ended as well as balanced matching circuits connected to different ports of the device 1900. There are many mixed-port devices in prevalent use. Examples include single-ended to balanced line baluns, filters, 3 dB Power splitters/combiners, low temperature co-fired ceramic devices, and high performance microprocessor components and the integrated circuits that support them.

FIG. 20 illustrates a single-ended embodiment of a matching network 2000. The single-ended matching network 2000 comprises a simplified version of the general balanced matching network 100. Specifically, and with reference to FIGS. 1 through 4 of the drawings, if the second input and output terminals 106, 112 of the balanced matching network 100 were connected to the ground potential 101, and the second shunt node 308 and the second and fourth series nodes 408 and 412 were also connected to the ground potential 101, the result is the single-ended matching network 2000 shown in FIG. 20. FIGS. 21 through 23 also show the resulting constituent single-ended impedance translation element 2100 and single-ended shunt and lattice networks 2200 and 2300. As one of ordinary skill in the art appreciates, terminating specific nodes to the reference potential 101 results in a far simpler impedance path as compared to the balanced configuration. The general elements shown in FIGS. 21 through 23 are used to create the single-ended matching network topology shown in FIG. 20. As with the general balanced matching network 100, it is possible to achieve additional embodiments of the single-ended matching network model by using additional shunt and series impedance elements in the circuit as appropriate for the application. A benefit of the general solution taught herein is that it may be applied to any circuit configuration created to model the balanced and single-ended matching networks 100 and 2000.

The single-ended matching network 2000 embodiment shown in FIG. 20 comprises first and second shunt impedance elements 2002 and 2004 and first and second series impedance elements 2006 and 2008. In order to calculate the S-parameters of the single-ended matching network 2000, the open-circuit impedance and short-circuit admittance is calculated for the constituent sub-circuit elements 2001 through 2008.

The open-circuit shunt impedance matrix [Z] of the FIG. 22 is given by:

$$Z = \begin{bmatrix} Z1 & Z1 \\ Z1 & Z1 \end{bmatrix} \quad (18)$$

The short-circuit series admittance matrix [Y] of the FIG. 23 is given by:

$$Y = \begin{bmatrix} \frac{1}{Z2} & \frac{1}{Z2} \\ \frac{1}{Z2} & \frac{1}{Z2} \end{bmatrix} \quad (19)$$

After determining the impedance or admittance matrices of the sub-circuits using equations (18) and (19), the S-parameters of each sub-circuit that comprises the single-ended matching network 2000 may be calculated using Equations (15) and (16). As one of ordinary skill in the art appreciates, in this case the matrix dimension of Equations (15) and (16) are 2 by 2. Using the teachings of the Embedding/De-embedding patent application, it is possible to determine the S-parameters of the cascaded combination of the two sub-circuits. Repeating this procedure multiple times for all sub-circuits in combination with the previously cascaded circuit, a single S-parameter matrix for the entire single-ended matching network 2000 may be determined. The resulting S-parameter matrix is normalized to the same reference characteristic impedance as the open-circuit impedance matrices and short-circuit admittance matrices of the constituent parts.

As previously discussed, VNAs permit characterization of a device in a fixed impedance environment The 50 ohm environment, however, is often not representative of the actual electrical impedance environment of a device. Typically, each device port is connected to an impedance that has a value different from an impedance connected to all other device ports. The ability to characterize a device in an impedance environment closer to the impedance environment in which the device will operate provides for a more accurate and reliable characterization. There is a need, therefore, to characterize a device with user-selected impedance values at each port of the characterized device. The teachings of the present invention permit prediction of the electrical behavior of the cascaded combination of the single-ended or balanced device 1900, 500 in combination with one or more of the single-ended or balanced matching networks 2000, 100 With specific reference to FIGS. 2 and 21, there is shown balanced and single-ended impedance translation elements 202 and 2100, respectively. The function of the impedance translation elements is to change the S-parameter matrix that is normalized to the reference characteristic impedance to a different impedance value. Ideally, a circuit designer may arbitrarily establish a normalizing impedance value that is different from the reference impedance value. It is further desirable, that each port of the device 500 or 1900 be normalized to an impedance that is independent of the normalizing impedance set for other ports of the device 500 or 1900. To achieve this impedance translation, a 2×2 matrix operation is used for the single-ended matching networks and a 4×4 matrix operation is used for the balanced matching networks. The normalization formulation described herein is for a balanced topology; therefor a 4 by 4 matrix operation is deployed. The same formulation may be used for the single-ended case, except that a 2×2 matrix operation is deployed.

For the balanced matching network 100, a solution for a 4×4 S-parameter matrix that is normalized to a characteristic impedance different from the reference characteristic impedance may be expressed in terms of the open-circuit impedance matrix, Z, or short-circuit admittance matrix, Y.

The mathematical equations solving for the S-parameters as a function of the network impedance normalized to a different characteristic impedance are:

$$S=(Zc^-+c)^{-1}(Zc^{-1}-c) \quad (20)$$

and $$S=(c^{-1}+Yc)^{-1}(c^{-1}-Yc) \quad (21)$$

where, the matrix, c, is a normalization matrix.

The normalization matrix is constructed so that elements where the row and column subscript are not equal have a value of zero. If the row and column subscript of the normalization matrix are equal, then the matrix element has a non-zero value. Accordingly, values are non-zero only along the matrix diagonal. The non-zero values are equal to the square root of a characteristic impedance for each port being normalized. If the normalization for a port is to remain as is, the matrix element has a value of the square root of the reference characteristic impedance $Z_{ref}$. Accordingly, if port i is to be normalized to a different characteristic impedance than the reference characteristic impedance, then the value of the matrix element in row i, column i is equal to the square root of the new characteristic impedance, $\sqrt{Z_{0i}}$, where i is equal to the port number to be normalized. The arbitrary impedance normalization matrix, c, for a two-port balanced device or four-terminal single-ended device, therefore, is given by:

$$c = \begin{bmatrix} \sqrt{Z_{01}} & 0 & 0 & 0 \\ 0 & \sqrt{Z_{02}} & 0 & 0 \\ 0 & 0 & \sqrt{Z_{03}} & 0 \\ 0 & 0 & 0 & \sqrt{Z_{04}} \end{bmatrix} \quad (22)$$

If all the ports are to be normalized to the reference impedance, then all values along the matrix diagonal for the normalization matrix have a value of $\sqrt{Z_{ref}}$. In this case, the reference characteristic normalization matrix is the matrix $c_{ref}$ and is defined for a two-port balanced device as:

$$c_{ref} = \begin{bmatrix} \sqrt{Z_{ref}} & 0 & 0 & 0 \\ 0 & \sqrt{Z_{ref}} & 0 & 0 \\ 0 & 0 & \sqrt{Z_{ref}} & 0 \\ 0 & 0 & 0 & \sqrt{Z_{ref}} \end{bmatrix} \quad (23)$$

The S-parameter matrix that is normalized to the reference characteristic normalization matrix $c_{ref}$ is matrix $S_{ref}$. The matrix S is defined as the S-parameter matrix that is normalized to the arbitrary impedance normalization matrix c. Both normalized S-parameter matrices, $S_{ref}$ and S, have the same open-circuit impedance or short-circuit admittance. The S-parameters are dependent upon the characteristic impedance normalization. S-parameters normalized to different characteristic impedances, however, does not alter the open-circuit impedance or short-circuit admittance corresponding to each S-parameter matrix. Accordingly, the impedance matrices calculated from both the S-parameter matrix normalized to a reference characteristic impedance and the S-parameter matrix normalized to an arbitrary characteristic impedance are equivalent to each other.

From Equations 20 and 21, the impedance and admittance matrices may be expressed as a function of the S-parameter matrix and the normalization matrix where:

$$Z=c(I+S)(I-S)^{-1}c \qquad (24)$$

and $$Y=c(I-S)(I+S)^{-1}c^{-1} \qquad (25)$$

Because the process of normalizing the S-parameter matrix does not alter either the open-circuit impedance, Z, or the short-circuit admittance, Y, then it is possible to apply the same equation for two different normalization cases. Using the principle of the equality of the impedance and admittance matrices regardless of the normalization, it is possible to solve for the S-parameter matrix with the arbitrary normalization as a function of the S-parameter matrix normalized to the reference characteristic impedance, the reference normalization matrix, $c_{ref}$, and the arbitrary normalization matrix, c. As an example, equation 24 is used to establish the impedance matrix, Z, as a function of both the S-parameter matrix normalized to the reference characteristic impedance, $S_{ref}$, and as a function of the S-parameter matrix normalized to the arbitrary impedance matrix, S. Accordingly:

$$Z=c(I+S)(I-S)^{-1}c \qquad (26)$$

and $$Z=c_{ref}(I+S_{ref})(I-S_{ref})^{-1}c_{ref} \qquad (27)$$

Using the principle of equality, the equations for Z may be set equal to each other where:

$$c(I+S)(I-S)^{-1}c=c_{ref}(I+S_{ref})(I-S_{ref})-1c_{ref} \qquad (28)$$

Solving for the S-parameter matrix, S:

$$S=(I-\alpha)(I+\alpha)^{-1} \text{ where } \alpha=c^{-1}c_{ref}(I+S_{ref})(I-S_{ref})c_{ref}c^{-1} \qquad (29)$$

Using the admittance matrix, the following also applies according to the same principles expressed in equations 26 through 29 where:

$$Y=c^{-1}(I-S)(I+S)^{-1}c^{-1} \qquad (30)$$

and $$Y=c_{ref}(I-S_{ref})(I+S_{ref})^{-1}c_{ref}^{-1} \qquad (31)$$

Using the principle of equality, the equations for Y may be set equal to each other where:

$$c^{-1}(I-S)(I+S)^{-1}c^{-1}=c_{ref}(I-S_{ref})(I+S_{ref})^{-1}c_{ref}^{-1} \qquad (32)$$

Solving for the S-parameter matrix, S:

$$S=(I-\beta)(I+\beta)^{-1} \text{ where } \beta=c_{ref}^{-1}(I-S_{ref})(I+S_{ref})^{-1}c \qquad (33)$$

Using the teachings of the present invention, therefore, the S-parameters for the cascaded combination of a balanced device, single-ended device, or a device with both kinds of ports with one or more matching networks may be predicted at either the reference characteristic impedance or at an arbitrary impedance.

Figure 24:
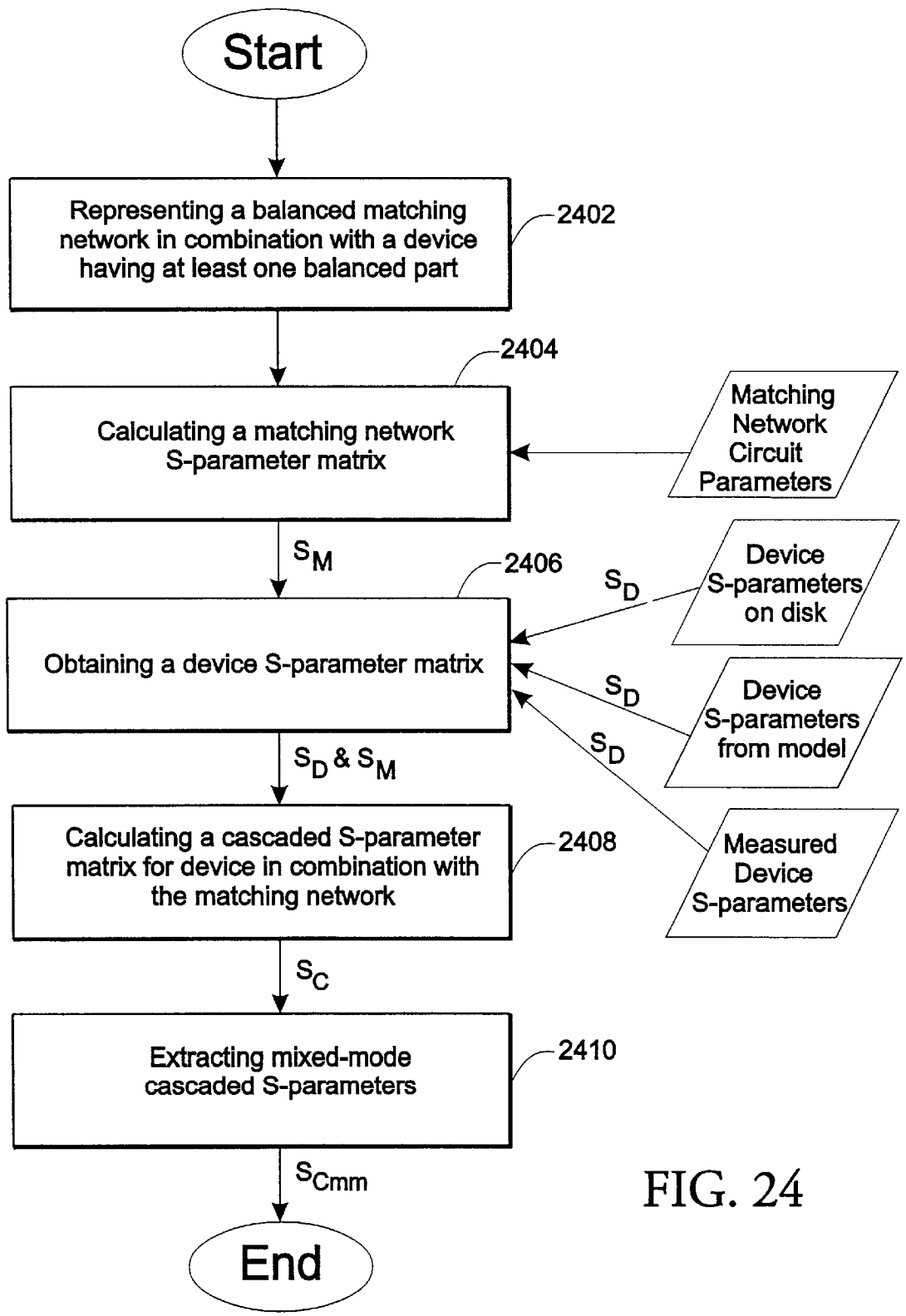
FIG. 24 is a flow chart representation of an embodiment of a method utilizing the teachings of the present invention.

It is beneficial to implement the teachings of the present invention in an embodiment that includes the processing, storage, and graphical user interface capability of a computer. With specific reference to FIG. 24 of the drawings, the matching balanced network 100 such as the one illustrated in FIG. 1 may be graphically presented to a designer of a device such as the one represented as balanced device 500 in FIG. 5 of the drawings. Each balanced port of the device 500 may be connected to a different balanced matching network 100 even though the general circuit topology representation is similar. Specifically, the circuit constructs of FIGS. 6 through 18 as well as others may be visually presented to the designer with a graphical user interface (herein "GUI"). In addition, an open and short may also be represented as an impedance element. Software on the computer permits the designer to "click" on one of the circuit constructs and "drop" it into one or more of the impedance elements in one of the balanced matching networks. One or more of the matching networks may be represented in the GUI to a designer of balanced and mixed-port devices. Software on the computer permits the designer to "click" on one of the circuit constructs as shown in FIGS. 6–18 of the drawings to select it and then "drop" the selected circuit construct into one or more of the impedance elements in one of the single-ended or balanced matching networks. With specific reference to step 2402 of FIG. 24 of the drawings, this "click & drop" process is repeated until all of the impedance elements that comprise the single-ended or balanced matching networks 100, 2000 are defined in terms of a circuit having impedance values. Also as part of the process, values for each electrical circuit, such as resistance, inductance, capacitance, Q-factor and operating frequency may be assigned as appropriate. This step culminates in the representation of all of the matching networks 100, 2000 in terms of their impedance elements, Z1 through Z14, shown as reference numerals 114 through 128 or 2002 through 2008, and impedance translation elements 202 or 2001. With specific reference to step 2404, when all of the single-ended or balanced matching networks 100, 2000 are defined with their constituent circuits, the processor of the computer is able to calculate the open circuit complex impedance matrix, Z, or the short circuit complex admittance matrix, Y, from equations (1) or (2) and (3) through (11). From the impedance or admittance matrices, Z or Y, the processor is able to calculate the associated S-parameters of the matching network, $S_M$, at the reference characteristic impedance. With specific reference to step 2406, it is also possible to obtain the S-parameters of the balanced device 500, $S_D$, at a reference characteristic impedance. The device S-parameters, $S_D$, may be obtained through a model of the device 500 and calculation of the expected S-parameters, through a measurement of the S-parameters of an actual device, or from a data file accessible by the computer having the appropriate device S-parameters stored for retrieval by the present process. With specific reference to step 2408 and using the teachings of the Embedding/De-embedding patent application, the processor is able to calculate the S-parameters of the cascaded combination of the balanced device 500 and the balanced matching networks 100, $S_c$. If desired, using equations (20) or (21), the processor is also able to calculate the cascaded S-parameters normalized at an arbitrary characteristic impedance for each port of the combination of the device 500 and the matching networks 100, 2000. With specific reference to step 2410, and with the benefit of the teachings of the '596 Provisional Application, the processor is then able to extract the mixed-mode S-parameters, $S_{cmm}$, of the resulting S-parameter matrix, $S_c$, to aid in the prediction of the electrical behavior of the balanced device 500 embedded in the plurality of matching networks 100, 2000. The software based implementation of the balanced case as illustrated in FIG. 24 of the drawings and disclosed above, may be adapted and used for the single-ended and mixed-port cases as well. An embodiment of a method according to the teachings of the present invention may be implemented using a personal computer with a Microsoft Windows Operating Environment using Microsoft Visual Studio 6.0, Roguewave Stringray Studio, Roguewave Math H++, and the Victor Imaging Processing Library software packages.

Embodiments of the invention have been described herein by way of example and in conjunction with accompanying drawings. The description herein is illustrative of certain preferred embodiments, but the scope of the invention is limited only by the appended claims.

What is claimed is:

1. A method of predicting electrical behavior of a device comprising the steps of:
    representing at least one balanced matching network having a balanced input port and a balanced output port,
    representing a connection of said at least one matching network between said balanced output port and a balanced port of said device,
    calculating a matching network S-parameter matrix,
    obtaining a device S-parameter matrix,
    calculating a cascaded S-parameter matrix for said matching network in combination with said device, and
    extracting mixed-mode cascaded S-parameters from said cascaded S-parameter matrix.

2. A method of predicting as recited in claim 1, the step of representing said at least one matching network further comprising the steps of representing said at least one matching network with a combination of a shunt network and a lattice network.

3. A method of predicting as recited in claim 2 and further comprising the step of representing said at least one matching network with an impedance translation element.

4. A method of predicting as recited in claim 1, said at least one matching network comprises a cascaded combination of a balanced impedance translation element, a first shunt network, a first lattice network, a second shunt network, and a second lattice network, wherein
    each said shunt network comprises a parallel impedance element between first and second shunt nodes, and first and second shunt elements between said first and second shunt nodes, respectively, and a reference potential, and
    each said lattice network comprises a first series impedance element between first and third lattice nodes, a second lattice impedance element between said second and fourth lattice nodes, a first cross impedance element between said first and fourth lattice nodes and a second cross impedance element between said second and third lattice nodes,
    calculating a corresponding matching network S-parameter matrix, and
    characterizing at least one port of said device in electrical combination with said matching network.

5. A method as recited in claim 1 wherein said step of calculating said matching network S-parameter matrix further comprises the steps of calculating an open circuit impedance matrix for each said first and second shunt networks and calculating a short circuit admittance matrix for each said first and second lattice impedance networks, calculating an impedance matrix for said matching network, and converting said impedance matrix to said matching network S-parameter matrix.

6. A method as recited in claim 5 and further comprising the step of normalizing said cascaded S-parameter matrix to an arbitrary characteristic impedance.

7. A method as recited in claim 1 and further comprising the step of extracting the multi-port mixed mode S-parameters from said S-parameter matrix.

8. A method as recited in claim 1 and further comprising the step of representing at least one single-ended matching network in electrical combination with at least one single-ended port of said device.

9. A method as recited in claim 8 and further comprising the step of representing a plurality of single-ended ports in electrical combination with a respective plurality of single-ended ports of said device.

10. A method as recited in claim 1 and further comprising the step of repeating said steps of representing and calculating for multiple balanced ports of said device.

11. A method as recited in claim 10 wherein said step of representing applies to common mode ports of said device.

12. A method as recited in claim 11 wherein said step representing applies to differential ports of said device.

13. A method as recited in claim 1 and further comprising the step of normalizing said cascaded S-parameter matrix to an arbitrary impedance value.

14. A method as recited in claim 13 and wherein said step of normalizing further comprises normalizing each port of said matching network to a different impedance value.

15. A system for predicting electrical behavior of a device comprising:
    a computational processing element,
    means for representing at least one balanced matching network having a balanced input port and a balanced output port,
    means for representing a connection of said at least one matching network between said balanced output port and a balanced port of said device,
    means for calculating a matching network S-parameter matrix,
    means for obtaining a device S-parameter matrix,
    means for calculating a cascaded S-parameter matrix for said matching network in combination with said device, and
    means for extracting mixed-mode cascaded S-parameters from said cascaded S-parameter matrix.

16. A system as recited in claim 15 and further comprising a graphical display device for obtaining external information regarding said matching network.

17. A system as recited in claim 15, wherein said means for representing said at least one matching network further comprises a means for representing said at least one matching network with a combination of a shunt network and a lattice network.

18. A system as recited in claim 17 wherein said means for representing further comprises means for representing said at least one matching network with an impedance translation element.

19. A system as recited in claim 15, wherein said at least one matching network comprises a cascaded combination of a balanced impedance translation element, a first shunt network, a first lattice network, a second shunt network, and a second lattice network, wherein
    each said shunt network comprises a parallel impedance element between first and second shunt nodes, and first and second shunt elements between said first and second shunt nodes, respectively, and a reference potential, and each said lattice network comprises a first series impedance element between first and third lattice nodes, a second lattice impedance element between said second and fourth lattice nodes, a first cross impedance element between said first and fourth lattice nodes and a second cross impedance element between said second and third lattice nodes, means for calculating a corresponding matching network S-parameter matrix, and means for characterizing at least one port of said device in electrical combination with said matching network.

20. A system as recited in claim 15 wherein said means for calculating said matching network S-parameter matrix further comprises means for calculating an open circuit impedance matrix for each said first and second shunt networks and means for calculating a short circuit admittance matrix for each said first and second lattice impedance networks, means for calculating an impedance matrix for said matching network, and means for converting said impedance matrix to said matching network S-parameter matrix.

21. A system as recited in claim 20 and further comprising means for normalizing said cascaded S-parameter matrix to an arbitrary characteristic impedance.

22. A system as recited in claim 15 and further comprising means for extracting multi-port mixed mode S-parameters from said cascaded S-parameter matrix.

23. A system as recited in claim 15 and further comprising means for representing at least one single-ended matching network in electrical combination with at least one single-ended port of said device.

24. A system as recited in claim 23 and further comprising means for representing a plurality of single-ended ports in electrical combination with a respective plurality of single-ended ports of said device.

25. A system as recited in claim 15 and further comprising means for repeating said steps of representing and calculating for multiple balanced ports of said device.

26. A system as recited in claim 15 and further comprising means for normalizing said S-parameter matrix to an arbitrary impedance value.

27. A system as recited in claim 26 and wherein said means for normalizing normalizes each port of said matching network to a different characteristic impedance value.

28. An article of manufacture comprising computer readable storage media including computer software embedded therein that causes a processing unit to perform the method comprising the steps of:

representing at least one balanced matching network having a balanced input port and a balanced output port, representing a connection of said at least one matching network between said balanced output port and a balanced port of said device, calculating a matching network S-parameter matrix, obtaining a device S-parameter matrix, calculating a cascaded S-parameter matrix for said matching network in combination with said device, and extracting mixed-mode cascaded S-parameters from said cascaded S-parameter matrix.

29. An article of manufacture as recited in claim 28, the step of representing said at least one matching network further comprising the steps of representing said at least one matching network with a combination of a shunt network and a lattice network.

30. An article of manufacture as recited in claim 29 and further comprising the step of representing said at least one matching network with an impedance translation element.

31. An article of manufacture as recited in claim 28, said at least one matching network comprises a cascaded combination of a balanced impedance translation element, a first shunt network, a first lattice network, a second shunt network, and a second lattice network, wherein each said shunt network comprises a parallel impedance element between first and second shunt nodes, and first and second shunt elements between said first and second shunt nodes, respectively, and a reference potential, and each said lattice network comprises a first series impedance element between first and third lattice nodes, a second lattice impedance element between said second and fourth lattice nodes, a first cross impedance element between said first and fourth lattice nodes and a second cross impedance element between said second and third lattice nodes, calculating a corresponding matching network S-parameter matrix, and characterizing at least one port of said device in electrical combination with said matching network.

32. An article of manufacture as recited in claim 28 wherein said step of calculating said matching network S-parameter matrix further comprises the steps of calculating an open circuit impedance matrix for each said first and second shunt networks and calculating a short circuit admittance matrix for each said first and second lattice impedance networks, calculating an impedance matrix for said matching network, and converting said impedance matrix to said matching network S-parameter matrix.

33. An article of manufacture as recited in claim 32 and further comprising the step of normalizing said cascaded S-parameter matrix to an arbitrary characteristic impedance.

34. An article of manufacture as recited in claim 33 and wherein said step of normalizing further comprises normalizing each port of said matching network to a different impedance value.

35. An article of manufacture as recited in claim 28 and further comprising the step of representing at least one single-ended matching network in electrical combination with at least one single-ended port of said device.

* * * * *